United States Patent
Eckert

(10) Patent No.: US 11,005,583 B1
(45) Date of Patent: May 11, 2021

(54) METHOD OF PERFORMING A DISTANCE-TO-FAULT MEASUREMENT AS WELL AS MEASUREMENT INSTRUMENT

(71) Applicant: Rohde & Schwarz GmbH & Co. KG, Munich (DE)

(72) Inventor: Hagen Eckert, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/787,526

(22) Filed: Feb. 11, 2020

(51) Int. Cl.
*H04B 17/391* (2015.01)

(52) U.S. Cl.
CPC .................. *H04B 17/391* (2015.01)

(58) Field of Classification Search
CPC ....... H04B 17/391; H04B 17/30; H04B 70/00
See application file for complete search history.

(56) References Cited

U.S. PATENT DOCUMENTS

| | | | |
|---|---|---|---|
| 3,588,611 A | 6/1971 | Lambden et al. | |
| 6,534,997 B1* | 3/2003 | Horishita | H04B 10/07 324/533 |
| 8,874,391 B2* | 10/2014 | Taylor | G01R 31/2822 702/59 |
| 2005/0203711 A1* | 9/2005 | Taylor | H04B 3/56 702/59 |
| 2005/0234662 A1* | 10/2005 | Niedzwiecki | H04B 3/46 702/60 |
| 2017/0199235 A1* | 7/2017 | Jeon | G01R 31/58 |

OTHER PUBLICATIONS

Ma, C., et al., "Ultrasonic Waveguides Detection-based approach to locate defect on workpiece," 2010 Chinese control and Decision Conference, pp. 757-761, May 2010.
Doane, J.L., "Measurement of Echoes Due to Spurious TEOn Modes in a Long-Distance 60-mm Waveguide Communication System," The Bell System Technical Journal 57(9):3253-3266, Nov. 1978.

* cited by examiner

*Primary Examiner* — Kenneth T Lam
(74) *Attorney, Agent, or Firm* — Christensen O'Connor Johnson Kindness PLLC

(57) ABSTRACT

A method of performing a distance-to-fault measurement of a signal processing device, comprising: performing a S11 measurement in amplitude and phase with equidistant frequency points assigned to an original frequency space, thereby obtaining original measurement points; calculating a virtual start frequency and a virtual stop frequency based on a start frequency and a stop frequency assigned to the original frequency space; determining virtual equidistant frequency points between the virtual start frequency and the virtual stop frequency; transforming the virtual equidistant frequency points into the original frequency space, thereby obtaining non-equidistant frequency points in the original frequency space; interpolating the original measurement points with respect to the non-equidistant frequency points, thereby obtaining interpolated measurement points; and performing an inverse transformation of the interpolated measurement points. Further, a measurement instrument for performing a distance-to-fault measurement of a signal processing device is described.

17 Claims, 2 Drawing Sheets

METHOD OF PERFORMING A DISTANCE-TO-FAULT MEASUREMENT AS WELL AS MEASUREMENT INSTRUMENT

FIELD OF THE DISCLOSURE

Embodiments of the present disclosure relate generally to a method of performing a distance-to-fault measurement of a signal processing device. Further, embodiments of the present disclosure relate generally to a measurement instrument for performing a distance-to-fault measurement of a signal processing device.

BACKGROUND

Distance-to-fault (DTF) measurements are typically done for performance verification as well as failure analysis of a signal processing device. For instance, a frequency domain reflectometry (FDR) measurement technique is used in order to precisely identify a signal path degradation within the signal processing device, for instance within a coax transmission line or within a waveguide transmission line.

The FDR measurement technique uses a swept radio frequency signal having a linear frequency grid, namely equidistant frequency points. The respective signals are reflected, wherein the reflected signals are measured in order to determine a respective reflection coefficient, for example the scattering parameter S11. S11 represents how much power is reflected by means of the signal processing device, and hence is known as the reflection coefficient. Accordingly, the S11 measurement is typically performed with equidistant frequency points.

Afterwards, an inverse fast Fourier transformation (IFFT) is performed on the reflected signals such that the respective information obtained is transformed into the time domain for further analysis. In some embodiments, the transformed data is taken into consideration in order to determine the distance at which the reflection occurs within the signal processing device by knowing the propagation velocity of the signals within the signal processing device to be investigated.

Typically, the distance-to-fault measurement outputs a radio frequency return loss or voltage standing wave ratio (VSWR) versus distance in order to identify any problems such as poor connections, damaged lines or faulty components within the signal processing device. Accordingly, the actual return loss versus distance is obtained in order to identify the distance at which the fault occurs, which corresponds to the result of the distance-to-fault measurement performed. However, measurements of the reflection performed by a linear frequency grid as well as the subsequent IFFT result in blurred or smeared results when testing a signal processing device having dispersion such as a waveguide. Accordingly, it is complicated to localize the failure due to the blurred or smeared results obtained.

SUMMARY

Accordingly, there is a need for a simple and cost-efficient way to perform distance-to-fault measurements ensuring accurate localization of the respective distance. The present disclosure provides a method of performing a distance-to-fault measurement of a signal processing device. In an embodiment, the method comprises the steps of:

performing a S11 measurement in amplitude and phase with equidistant frequency points assigned to an original frequency space, thereby obtaining original measurement points;

calculating a virtual start frequency and a virtual stop frequency based on a start frequency and a stop frequency assigned to the original frequency space;

determining virtual equidistant frequency points between the virtual start frequency and the virtual stop frequency;

transforming the virtual equidistant frequency points into the original frequency space, thereby obtaining non-equidistant frequency points in the original frequency space;

interpolating the original measurement points with respect to the non-equidistant frequency points, thereby obtaining interpolated measurement points; and performing an inverse transformation of the interpolated measurement points.

Moreover, the present disclosure provides a method of performing a distance-to-fault measurement of a signal processing device. In an embodiment, the method comprising the steps of:

performing a S11 measurement in amplitude and phase with a non-linear frequency grid assigned to an original frequency space, thereby obtaining original measurement points;

interpolating the original measurement points, thereby obtaining interpolated measurement points; and performing an inverse transformation of the interpolated measurement points.

Further, the present disclosure provides a measurement instrument for performing a distance-to-fault measurement of a signal-processing device. In an embodiment, the measurement instrument comprises a signal source and a processing circuit or module. The signal source is configured to provide a signal. In some embodiments, the processing module is configured to:

perform a S11 measurement in amplitude and phase with equidistant or non-equidistant frequency points assigned to an original frequency space, thereby obtaining original measurement points;

calculate a virtual start frequency and a virtual stop frequency based on a start frequency and a stop frequency assigned to the original frequency space;

determine virtual equidistant frequency points between the virtual start frequency and the virtual stop frequency;

transform the virtual equidistant frequency points into the original frequency space, thereby obtaining non-equidistant frequency points in the original frequency space;

interpolate the original measurement points with respect to the non-equidistant frequency points, thereby obtaining interpolated measurement points; and perform an inverse transformation of the interpolated measurement points.

The present disclosure is based on the finding that a technically simple solution for performing the distance-to-fault measurement is obtained since the respective measurement is done with an equidistant frequency grid encompassing equidistant frequency points or a non-equidistant frequency grid encompassing non-equidistant frequency points. When performing the S11 measurement, measurement results, namely the original measurement points, are obtained in the original frequency space. The frequency points used for performing the S11 measurement comprise the start frequency and the stop frequency. Then, the virtual start frequency and the virtual stop frequency are calculated in a virtual frequency space wherein the start frequency and the stop frequency within the original frequency space are taken into account.

In the calculated virtual frequency space, the virtual equidistant frequency points are determined between the virtual start frequency and the virtual stop frequency. Afterwards, these virtual equidistant frequency points are transformed into the original frequency space, yielding non-equidistant frequency points in the original frequency space or rather the non-linear frequency grid. In addition, the original measurement points assigned to the original frequency space are interpolated with respect to the non-equidistant frequency points or rather the non-linear frequency grid. In other words, the original measurement points are interpolated such that interpolated measurement points are obtained that are associated with the non-equidistant frequency points of the non-linear frequency grid. Thus, measurement points are obtained that correspond to measurement points of a S11 measurement using non-equidistant frequency points. However, the S11 measurement may have been performed by using equidistant frequency points such that simple measurement instruments can be used instead of high-end measurement instruments.

In other words, the non-linear frequency grid encompassing the non-equidistant frequency points is obtained by means of the transformation performed by software means. The respective non-linear frequency grid is used for interpolating the original measurement points assigned to the linear frequency grid such that measurement points, namely the interpolated ones, are obtained that are associated with the non-linear frequency grid. The respective S11 measurement can be performed by a simple and cost-efficient measurement instrument since equidistant frequency points are used for performing the measurement. In an embodiment, the non-equidistant frequency grid ensuring the accurate localization within a signal processing device having dispersion may be obtained, for example, by software, a specifically programmed processor, etc.

In some embodiments, the measurement of the scattering parameter or rather the reflection coefficient is still performed by using the linear frequency grid. However, a non-linear frequency grid, namely the non-equidistant frequency points, is calculated by software, a specifically programmed processor, etc., namely by performing the respective calculations and/or transformations. Then, the non-linear frequency grid calculated/transformed is used for interpolating the original measurement points by means of the S11 measurement using the linear frequency grid such that interpolated measurement points are gathered that correspond to ones obtained when performing a S11 measurement with a non-linear frequency grid.

In other words, the non-linear frequency grid corresponds to the frequency grid intended for the distance-to-fault measurement, namely the localization of the fault. Therefore, the original measurement points are interpolated accordingly with respect to the non-equidistant frequency points.

Afterwards, the interpolated measurement points obtained by the interpolation, namely the ones associated with the non-linear frequency grid, are transformed via the inverse transformation such that complex-valued measurement points are obtained. These complex-valued measurement points relate to complex-valued output points.

In some embodiments, complex-valued input points are processed by the inverse transformation in order to generate the complex-valued output points.

In general, the respective method can be performed by the measurement instrument, which may correspond to a hand-held device, for instance a hand-held analyzer. Thus, it is not necessary to use a high-end analyzer for performing the distance-to-fault measurement, as the respective S11 measurement does not require using a non-equidistant frequency grid, as the respective measurement points are transformed and interpolated by software, for example, emulating the non-linear frequency grid.

The S11 measurement corresponds to a measurement of the reflection coefficient, wherein S11 corresponds to the respective scattering parameter.

In some embodiments, the method of performing a distance-to-fault measurement of a signal processing device comprises the steps of:

Performing a S11 measurement in amplitude and phase with a non-linear frequency grid assigned to an original frequency space, thereby obtaining original measurement points;

Calculating a virtual start frequency and a virtual stop frequency based on a start frequency and a stop frequency assigned to the original frequency space; Determining virtual equidistant frequency points between the virtual start frequency and the virtual stop frequency;

Transforming the virtual equidistant frequency points into the original frequency space, thereby obtaining non-equidistant frequency points in the original frequency space;

Interpolating the original measurement points with respect to the non-equidistant frequency points, thereby obtaining interpolated measurement points; and Performing an inverse transformation of the interpolated measurement points.

According to an aspect, at least one distance-to-fault diagram is created based on the interpolated measurement points. The interpolated measurement points are obtained after the transformation and the interpolation mentioned above. The distance-to-fault diagram is created based on the output of the inverse transformation that is performed on the interpolated measurement points. The distance-to-fault diagram typically illustrates the return loss versus distance such that the distance-to-fault can be visualized by the diagram created. In some embodiments, the processing circuit or module is configured to create the at least one distance-to-fault diagram.

According to another aspect, the virtual start frequency and the virtual stop frequency are assigned to a second frequency space different to the original frequency space. In some embodiments, the original start frequency as well as the original stop frequency that are assigned to the original frequency space are converted into the second frequency space, namely the virtual frequency space encompassing the virtual start frequency and the virtual stop frequency. Hence, a conversion between different frequency spaces take place when calculating and/or transforming the respective frequencies, namely the virtual start frequency and the virtual stop frequency or rather the non-equidistant frequency points.

The virtual start frequency and the virtual stop frequency may be calculated such that the wavelength of the signal is the same in the original frequency space and the second frequency space. Thus, calculating the virtual start frequency and the virtual stop frequency is done such that the wavelength of the respective signal is the same in both frequency spaces, also called frequency domains. In other words, the wavelength is maintained when transforming/calculating the respective frequencies. In some embodiments, the processing module is configured to calculate the virtual start frequency and the virtual stop frequency such that the wavelength of the signal is the same in the original frequency space and the second frequency space.

In some embodiments, the virtual equidistant frequency points determined are assigned to the second frequency space. As the virtual equidistant frequency points are determined between the virtual start frequency and the virtual stop frequency, the respective virtual frequency points are also assigned to the second frequency space that encompasses the virtual start frequency and the virtual stop frequency. As already mentioned, the second frequency space may be called virtual frequency space, as it is a virtual one compared to the one of the signal processing device, which is called the original frequency space. In some embodiments, the processing module is configured to transform the virtual equidistant frequency points from the second frequency space into the original frequency space.

Another aspect provides that the virtual equidistant frequency points are transformed from the second frequency space in the original frequency space. Thus, the transformation of the virtual equidistant frequency points corresponds to a back-transformation into the original frequency space.

The phase and amplitude may be interpolated separately, for example the unwrapped phase. Accordingly, the amplitude values as well as the phase values of the reflection parameters are interpolated separately with respect to the non-equidistant frequency points or rather non-linear frequency grid. In some embodiments, the processing module is configured to interpolate phase and amplitude separately.

In some embodiments, the virtual start frequency and the virtual stop frequency may be assigned to free space. Therefore, the respective frequencies assigned to the signal processing device, namely the original frequency space, are converted into free space frequencies when calculating the virtual start frequency and the virtual stop frequency based on the start frequency and the stop frequency.

In some embodiments, the inverse transformation may be an inverse fast Fourier transformation (IFFT). Accordingly, the distance-to-fault diagram can be generated in a fast and easy manner while using the IFFT.

The signal processing device may be a waveguide, for instance a hollow conductor. Generally, the signal processing device may be a device having dispersion like a waveguide.

For interpolating the original measurement points with respect to the non-equidistant frequency points, interpolation algorithms like a spline interpolation or a cubic interpolation may be used, for example.

The interpolation may result in a number of interpolated measurements points that is different to the number of the original measurement points. However, the numbers may also be equal.

Moreover, a scaling of the distance-to-fault diagram created is provided in some embodiments. The scaling concerns the x-axis of the diagram, as the velocity in the waveguide is lower than the speed of light. Generally, a scaling factor is implemented that depends on the start frequency, the stop frequency and the cut-off frequency of the measurement and the waveguide, respectively. The scaling factor may be calculated as a type of mean value or a center of gravity of the velocity factor diagram in the virtual frequency space.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
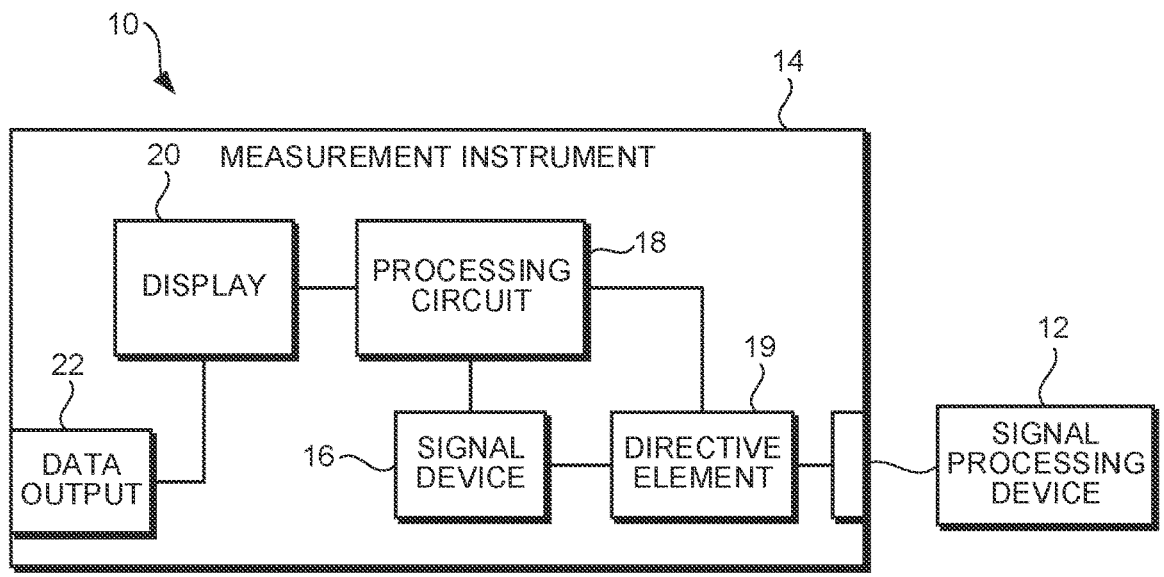
FIG. 1 schematically shows a representative embodiment of a measurement instrument according to the present disclosure.

FIG. 1 shows a measurement system 10 comprising a signal processing device 12 established by a device having dispersion, for instance a waveguide, also called hollow conductor. The measurement system 10 also comprises a measurement instrument 14 that is configured to perform a distance-to-fault measurement of the signal processing device 12, as will be described hereinafter.

In the embodiment shown, the measurement instrument 14 comprises a signal source 16 that is configured to provide a signal to be forwarded to the signal processing device 12 for testing purposes. The measurement instrument 14 also includes a processing circuit or module 18 that is, inter alia, configured to control the signal source 16 and to analyze signals received, namely reflected signals, in order to perform the distance-to-fault measurement.

In general, the processing module 18 is configured to receive both the forward signal and the reflected signal. For this purpose, a directive element 19, for instance a directional coupler, is provided that is assigned to the port of the measurement instrument 14, which is connected with the processing device 12. In some embodiments, the processing module 18 can use the respective information obtained in order to calculate the reflection coefficient by a S11 measurement, wherein S11 corresponds to the respective scattering parameter.

Figure 2:
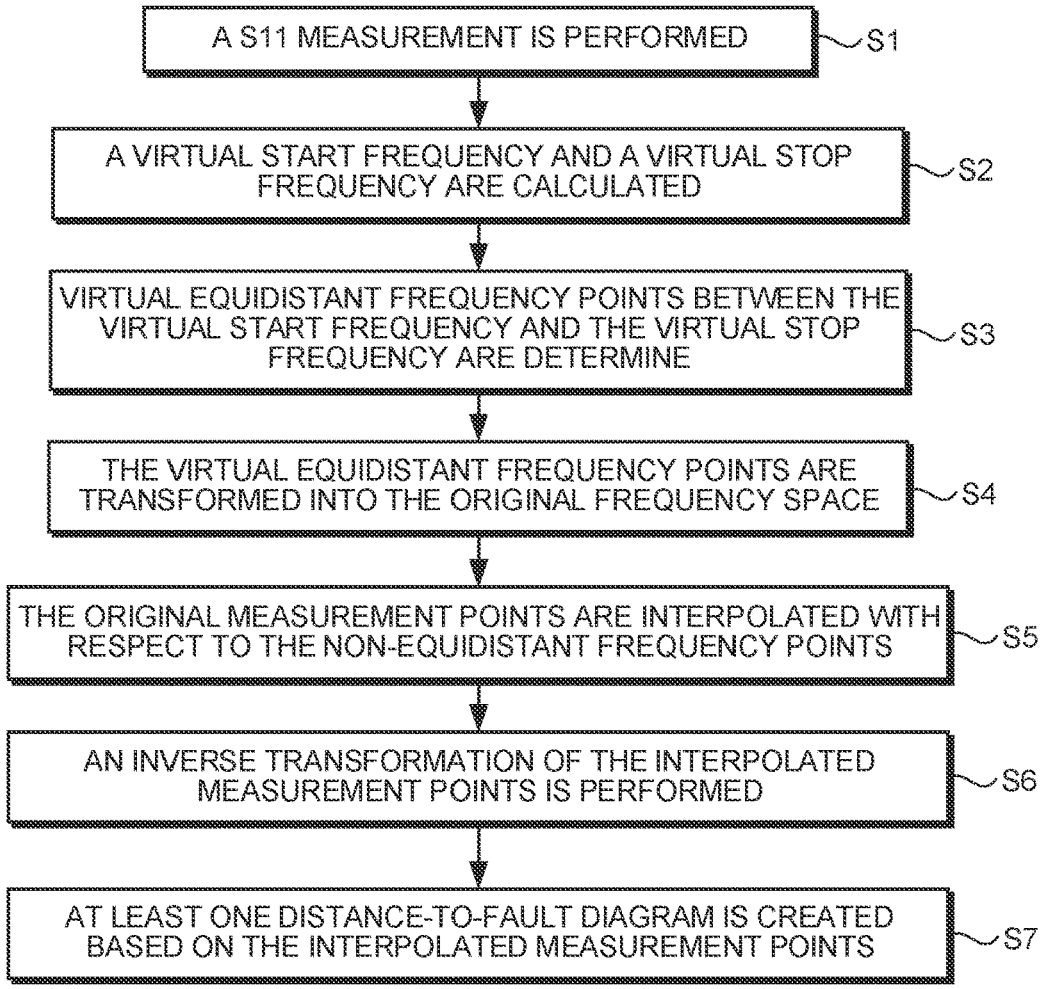
FIG. 2 schematically shows a flow-chart of a representative method of performing a distance-to-fault measurement of a signal processing device according to the present disclosure.

In general, the measurement instrument 14 is configured to perform a method of performing a distance-to-fault measurement as illustrated in FIG. 2 to which reference is made hereinafter. In some embodiments, the measurement instrument 14 is configured to carry out one or more steps of method claims 1-14.

In a first step S1, a S11 measurement, namely a measurement of reflection coefficient, is performed in amplitude and phase with equidistant frequency points that are assigned to an original frequency space, namely the frequency space assigned to the signal processing device 12, for instance the waveguide. When performing the S11 measurement, original measurement points are obtained that are assigned to the equidistant frequency points used during the S11 measurement. The original measurement points correspond to the measured values of the reflected signals that are received by the processing module 18.

In a second step S2, a virtual start frequency and a virtual stop frequency are calculated based on a start frequency and a stop frequency assigned to the original frequency space. Accordingly, a frequency swept in the original frequency space was performed during the S11 measurement, as the equidistant frequency points were used. The respective frequency swept has a start frequency and a stop frequency that are assigned to the original frequency space. These original start and stop frequencies are re-calculated or converted into a virtual frequency space in order to obtain the virtual start frequency and the virtual stop frequency.

In some embodiments, the virtual start frequency and the virtual stop frequency are associated with another, second frequency space, namely the virtual one. The virtual frequency space is different to the original frequency space. For instance, the virtual start frequency and the virtual stop frequency are associated with free space rather than the signal processing device 12, namely the waveguide, having cut-off frequencies and/or input frequencies.

During the calculation of the virtual start frequency and the virtual stop frequency, it might be ensured that the wavelength of the signal is maintained. In other words, the wavelength of the signal is the same in the original frequency space and the second frequency space, namely the virtual frequency space or rather the free space.

Accordingly, the recalculation or conversion from the original frequency space, namely the frequency space assigned to the signal processing device 12, to the virtual free space frequency while maintaining the wavelength is obtained by the following equation:

$$f_{virt} = f_{WG} * \sqrt{1 - \frac{f_{cut}^2}{f_{WG}^2}},$$

wherein $f_{virt}$ corresponds to the virtual frequency in the free space, namely the another frequency space.

The virtual frequency ensures that the respective wavelength is maintained. Hence, the wavelength provided in the signal processing device 12, namely the waveguide, corresponds to the one in the free space. Further, $f_{WG}$ corresponds to the frequency in the signal processing device 12, namely the waveguide. Hence, $f_{WG}$ is associated with the original frequency space. In addition, $f_{cut}$ corresponds to the cut-off frequency of the signal processing device 12, namely the waveguide. The cut-off frequency can be determined, for example mathematically calculated or estimated, based on known characteristics of the signal processing device 12, namely the waveguide. The upper cut-off frequency is twice the lower cut-off frequency. The respective start and stop frequencies may correspond to 10% and 90% of the range provided by the cut-off frequencies.

With the equation provided above, the respective virtual start frequency and the virtual stop frequency can be calculated appropriately.

In a third step S3, virtual equidistant frequency points between the virtual start frequency and the virtual stop frequency are determined. The virtual equidistant frequency points are also assigned to the second frequency space, namely the free space or the virtual frequency space.

In a fourth step S4, the virtual equidistant frequency points are transformed into the original frequency space, thereby obtaining non-equidistant frequency points in the original frequency space. In other words, the virtual equidistant frequency points determined between the virtual start frequency and the virtual stop frequency, which are assigned to the second frequency space, are re-transformed from the another frequency space in the original frequency space. This can be ensured by the following equation:

$$f_{WG} = \sqrt{f_{cut}^2 + f_{virt}^2}.$$

In a fifth step S5, the original measurement points are interpolated with respect to the non-equidistant frequency points. Put differently, the original measurement points are interpolated while taking the non-linear frequency grid into consideration that encompasses the non-equidistant frequency points. Hence, interpolated measurement points are obtained that are associated with these non-equidistant frequency points.

For instance, phase and amplitude of the respective reflection coefficients are interpolated separately.

As mentioned above, the interpolated measurement points are assigned to the non-linear frequency grid, as they have been interpolated with respect to the non-equidistant frequency points. Accordingly, measurement points assigned to the non-linear frequency grid are gathered even though the original S11 measurement was performed by using the linear frequency grid, which can be performed by a hand-held (network) analyzer.

In some embodiments, the non-linear frequency grid to which the interpolated measurement points are assigned is obtained by software, a specifically programmed processor, etc., namely the processing module 18.

In a sixth step S6, an inverse transformation of the interpolated measurement points is performed, wherein the inverse transformation may relate to an inverse fast Fourier transformation (IFFT). Thus, the respective information is transformed into the time domain for further analysis, for example visualization.

In a seventh step S7, at least one distance-to-fault diagram is created based on the interpolated measurement points, for example the output of the inverse transformation that is performed on the interpolated measurement points. The respective diagram may be generated by the processing module 18.

The diagram may be displayed on a display 20 of the measurement instrument 14. Alternatively, a data output 22 is provided via which the data of the diagram created is outputted for being displayed on a separate display device.

In some embodiments, only the magnitude of the complex-valued output points is displayed in the distance-to-fault diagram created.

Figure 3A:
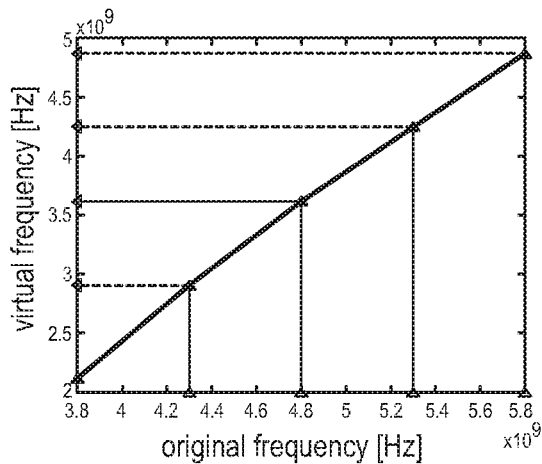
FIGS. 3A and 3B show two diagrams illustrating frequency grids assigned to the original frequency space and the virtual frequency space while dispersion occurs.
Figure 3B:
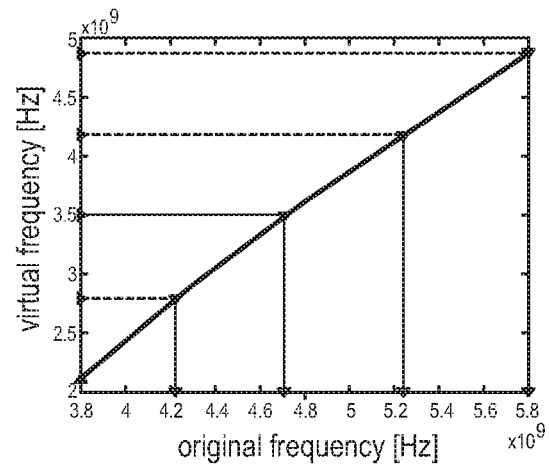

In FIGS. 3A and 3B, two diagrams are shown that illustrate frequency grids assigned to the original frequency space and the virtual frequency space are shown wherein dispersion is visible. In some embodiments, the first diagram (FIG. 3A) relates to the transformation from the original frequency space to the virtual one, whereas the second diagram (FIG. 3B) relates to the transformation from the virtual frequency space to the original one. The differences become obvious when comparing both diagrams, for example the respective frequency grids shown.

Accordingly, FIGS. 3A and 3B illustrate the conversion from the linear frequency grid to the non-linear frequency grid within the original frequency space.

Figure 4:
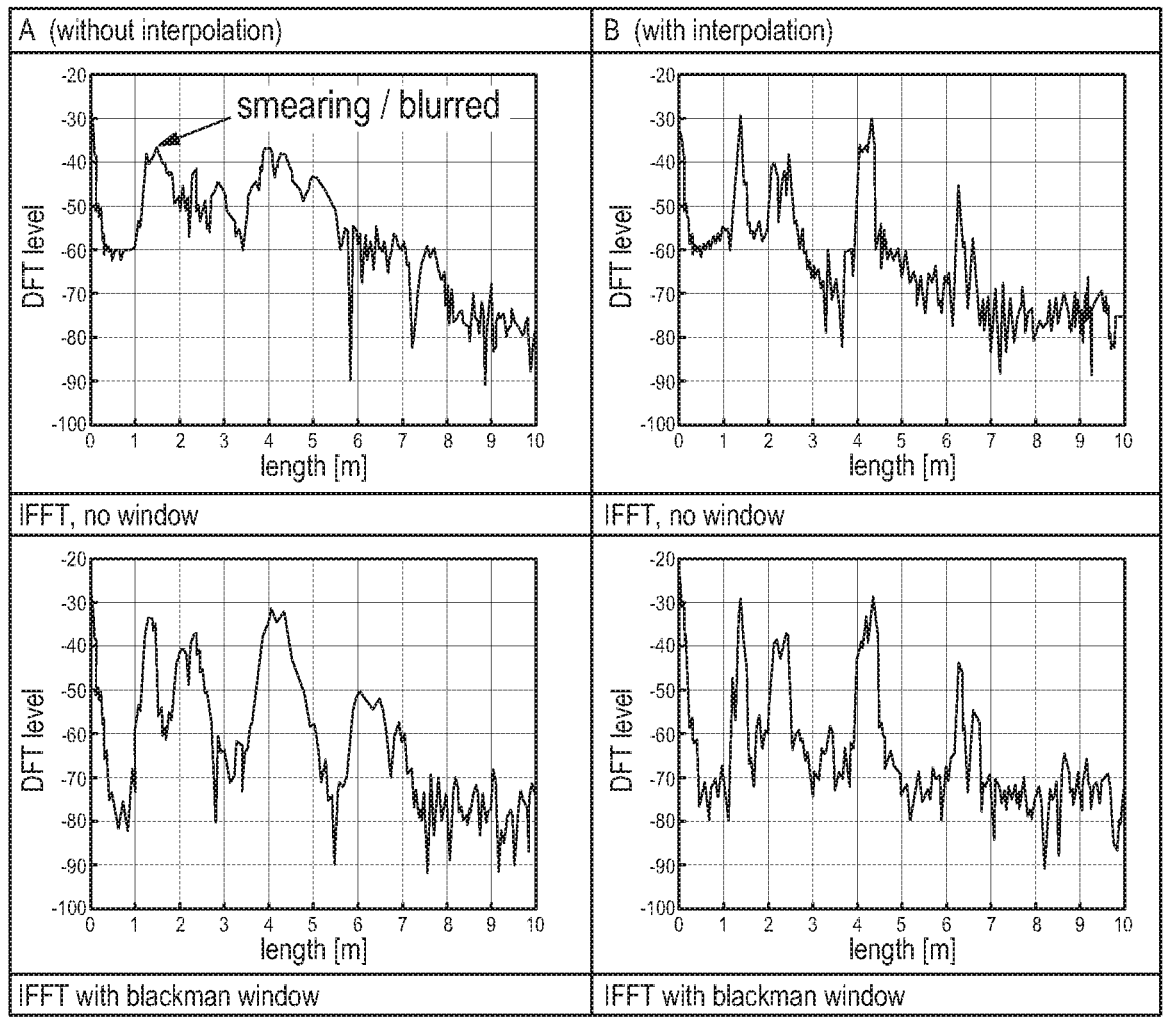
FIG. 4 shows a diagram illustrating the advantages of the claimed subject matter according to the present disclosure compared to the prior art.

In FIG. 4, the respective distance-to-fault diagram obtained by one or more methods according to the present disclosure is shown in comparison to a distance-to-fault diagram obtained by a method known from the state of the art using only equidistant frequency points without any interpolation.

It becomes obvious that the respective results obtained by means of a measurement according to the present disclosure do not provide any blurred of smeared effects in the output, yielding better or rather accurate information on the distance-to-fault, for example compared to the techniques known in the state of the art.

Moreover, it is shown in FIG. 4 that window functions, for instance a blackman window, may be applied when performing the inverse transformation.

Alternatively, a non-linear frequency grid can be used when performing the S11 measurements instead of the above-mentioned linear frequency grid. Then, it might not be necessary to calculate the virtual start frequency and the virtual stop frequency based on the start frequency and the stop frequency assigned to the original frequency space in order to determine the virtual equidistant frequency points between the virtual start frequency and the virtual stop frequency, which are transformed into the original frequency space for obtaining non-equidistant frequency points in the original frequency space since the non-linear frequency grid has already been used initially. However, the respective steps may also be done.

Moreover, a scaling of the distance-to-fault diagram created is performed in some embodiments, wherein the scaling concerns the x-axis of the distance-to-fault diagram, as the velocity in the waveguide is lower than the speed of light.

Therefore, a scaling factor is implemented that depends on the start frequency, the stop frequency and the cut-off frequency of the measurement and the waveguide, respectively.

The scaling factor $VF_r$ for the original frequency space, also called real frequency space, may be calculated as follows:

$$VF_r = \sqrt{1 - \frac{f_{cut}^2}{f_r^2}}.$$

The scaling factor $VF_v$ for the virtual frequency space may be calculated as follows, wherein the following substitution $f_r^2 = f_v^2 + f_{cut}^2$ is used:

$$VF_v = \sqrt{1 - \frac{f_{cut}^2}{f_v^2 + f_{cut}^2}} = \sqrt{\frac{f_v^2}{f_v^2 + f_{cut}^2}}$$

The scaling factor may be calculated as a type of mean value:

$$meanVF = \frac{1}{f_{v2} - f_{v1}} \int_{f_{v1}}^{f_{v2}} VF_v df_v = \frac{f_{r2} - f_{r1}}{f_{v2} - f_{v1}} = \frac{\text{span in original frequency space}}{\text{spran in virtual frequency space}}$$

Alternatively, the scaling factor may be calculated as a center of gravity of the velocity factor diagram.

The scaling factor may be calculated by:

$$meanVF = \frac{f_{r2} - f_{r1}}{f_{v2} - f_{v1}} = \frac{\frac{f_{v2} + f_{v1}}{2}}{\frac{f_{r2} + f_{r1}}{2}} = \frac{\text{center frequency in virtual frequency space}}{\text{center frequency in original frequency space}}$$

Generally, a simple and cost-efficient way is provided in order to perform a distance-to-fault measurement that ensures accurate results.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of performing a distance-to-fault measurement of a signal processing device, the method comprising:
   performing a S11 measurement in amplitude and phase with equidistant frequency points assigned to an original frequency space by a measurement instrument having a processing circuit, thereby obtaining original measurement points;
   calculating, by said processing circuit, a virtual start frequency and a virtual stop frequency based on a start frequency and a stop frequency assigned to said original frequency space;
   determining, by said processing circuit, virtual equidistant frequency points between said virtual start frequency and said virtual stop frequency;
   transforming, by said processing circuit said virtual equidistant frequency points into said original frequency space, thereby obtaining non-equidistant frequency points in said original frequency space;
   interpolating, by said processing circuit said original measurement points with respect to said non-equidistant frequency points, thereby obtaining interpolated measurement points; and
   performing, by said processing circuit an inverse transformation of said interpolated measurement points.

2. The method according to claim 1, wherein at least one distance-to-fault diagram is created by said processing circuit based on said interpolated measurement points.

3. The method according to claim 1, wherein said virtual start frequency and said virtual stop frequency are assigned to another frequency space different to said original frequency space.

4. The method according to claim 3, wherein said virtual start frequency and said virtual stop frequency are calculated by said processing circuit such that the wavelength of said signal is the same in said original frequency space and said another frequency space.

5. The method according to claim 3, wherein said virtual equidistant frequency points determined are assigned to said another frequency space.

6. The method according to claim 1, wherein said virtual equidistant frequency points are transformed by said processing circuit from said another frequency space in said original frequency space.

7. The method according to claim 1, wherein phase and amplitude are interpolated separately by said processing circuit.

8. The method according to claim 1, wherein said virtual start frequency and said virtual stop frequency are assigned to free space.

9. The method according to claim 1, wherein said inverse transformation is an inverse fast Fourier transformation.

10. The method according to claim 1, wherein said signal processing device is a waveguide.

11. The method according to claim 1, wherein said signal processing device is a device having dispersion.

12. A method of performing a distance-to-fault measurement of a signal processing device, the method comprising:
   performing a S11 measurement in amplitude and phase with a non-linear frequency grid assigned to an original frequency space by a measurement instrument having a processing circuit, thereby obtaining original measurement points;
   interpolating said original measurement points by said processing circuit, thereby obtaining interpolated measurement points; and
   performing an inverse transformation of said interpolated measurement points by said processing circuit.

13. The method according to claim 12, wherein the method further comprises:
   calculating by said processing circuit a virtual start frequency and a virtual stop frequency based on a start frequency and a stop frequency assigned to said original frequency space;
   determining by said processing circuit virtual equidistant frequency points between said virtual start frequency and said virtual stop frequency; and
   transforming by said processing circuit said virtual equidistant frequency points into said original frequency space, thereby obtaining non-equidistant frequency points in said original frequency space,
   wherein said original measurement points are interpolated with respect to said non-equidistant frequency points by said processing circuit in order to obtain said interpolated measurement points.

14. A measurement instrument for performing a distance-to-fault measurement of a signal processing device, said measurement instrument comprising a signal source and a processing circuit, said signal source being configured to provide a signal, said processing circuit being configured to:
   perform a S11 measurement in amplitude and phase with equidistant or non-equidistant frequency points assigned to an original frequency space, thereby obtaining original measurement points;
   calculate a virtual start frequency and a virtual stop frequency based on a start frequency and a stop frequency assigned to said original frequency space;
   determine virtual equidistant frequency points between said virtual start frequency and said virtual stop frequency;
   transform said virtual equidistant frequency points into said original frequency space, thereby obtaining non-equidistant frequency points in said original frequency space;
   interpolate said original measurement points with respect to said non-equidistant frequency points, thereby obtaining interpolated measurement points; and
   perform an inverse transformation of said interpolated measurement points.

15. The measurement instrument according to claim 14, wherein said processing circuit is configured to calculate said virtual start frequency and said virtual stop frequency such that the wavelength of said signal is the same in said original frequency space and said another frequency space.

16. The measurement instrument according to claim 14, wherein said processing circuit is configured to transform said virtual equidistant frequency points from said another frequency space into said original frequency space.

17. The measurement instrument according to claim 14, wherein said processing circuit is configured to interpolate phase and amplitude separately.

* * * * *